(12) United States Patent
Ellsworth, Jr. et al.

(10) Patent No.: US 6,684,501 B2
(45) Date of Patent: Feb. 3, 2004

(54) FOIL HEAT SINK AND A METHOD FOR FABRICATING SAME

(75) Inventors: Michael J. Ellsworth, Jr., Lagrangeville, NY (US); Egidio Marotta, Poughkeepsie, NY (US); Budy D. Notohardjono, Poughkeepsie, NY (US); Roger R. Schmidt, Poughkeepsie, NY (US); Prabjit Singh, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/105,698

(22) Filed: Mar. 25, 2002

(65) Prior Publication Data

US 2003/0178190 A1 Sep. 25, 2003

(51) Int. Cl.[7] .................................................. H05K 7/20
(52) U.S. Cl. .................... 29/890.03; 165/80.3; 165/185; 174/16.3; 257/722; 361/704
(58) Field of Search ................................ 165/80.3, 185; 174/16.3; 257/722; 361/704; 29/890.03

(56) References Cited

U.S. PATENT DOCUMENTS

| | | | | | |
|---|---|---|---|---|---|
| 4,270,604 | A | * | 6/1981 | Nakamura | 165/185 |
| 4,471,837 | A | | 9/1984 | Larson | 165/185 |
| 4,498,530 | A | * | 2/1985 | Lipschutz | 165/185 |
| 4,777,560 | A | * | 10/1988 | Herrell et al. | 165/80.3 |
| 5,020,586 | A | * | 6/1991 | Mansingh | 165/80.3 |
| 5,381,859 | A | * | 1/1995 | Minakami et al. | 165/80.3 |
| 5,583,317 | A | * | 12/1996 | Mennucci et al. | 174/16.3 |
| 5,758,418 | A | * | 6/1998 | Chrysler et al. | 29/890.03 |
| 5,781,411 | A | | 7/1998 | Feenstra | 361/704 |
| 5,957,194 | A | * | 9/1999 | Azar | 165/80.3 |
| 6,076,594 | A | * | 6/2000 | Kuo | 165/80.3 |
| 6,097,598 | A | | 8/2000 | Miyahara et al. | 361/704 |
| 6,105,662 | A | | 8/2000 | Suzuki | 165/104.33 |
| 6,152,213 | A | | 11/2000 | Suzuki | 165/104.33 |
| 6,199,627 | B1 | * | 3/2001 | Wang | 165/185 |
| 6,208,513 | B1 | | 3/2001 | Fitch et al. | 361/704 |
| 6,336,498 | B1 | * | 1/2002 | Wei | 165/80.3 |
| 6,401,810 | B1 | * | 6/2002 | Kuo et al. | 165/185 |
| 6,449,160 | B1 | * | 9/2002 | Tsai | 361/704 |
| 6,474,407 | B1 | * | 11/2002 | Chang et al. | 165/80.3 |
| 6,545,867 | B2 | * | 4/2003 | Ozawa | 361/704 |

FOREIGN PATENT DOCUMENTS

JP            03239396 A   * 10/1991   .................. 361/704

* cited by examiner

Primary Examiner—Leonard R. Leo
(74) Attorney, Agent, or Firm—Floyd A. Gonzalez; Cantor Colburn LLP

(57) ABSTRACT

A design and method for fabricating a foil heat sink including a fin body, wherein the fin body includes a plurality of heat sink fins having a fin head and a fin foot and wherein the plurality of heat sink fins are disposed in a parallel fashion so as to form a plurality of horizontal channels between the plurality of heat sink fins, a fin support, wherein the fin support includes a plurality of fin support structures disposed between the plurality of heat sink fins so as to separate the plurality of heat sink fins and wherein the plurality of fin support structures are disposed adjacent to the fin head so as to form a plurality of vertical channels between the plurality of heat sink fins, and a fin base, wherein the fin base includes a plurality of fin spacers disposed between the plurality of heat sink fins so as to separate the plurality of heat sink fins and wherein the plurality of fin spacers are disposed so as to be adjacent to the fin foot.

15 Claims, 13 Drawing Sheets

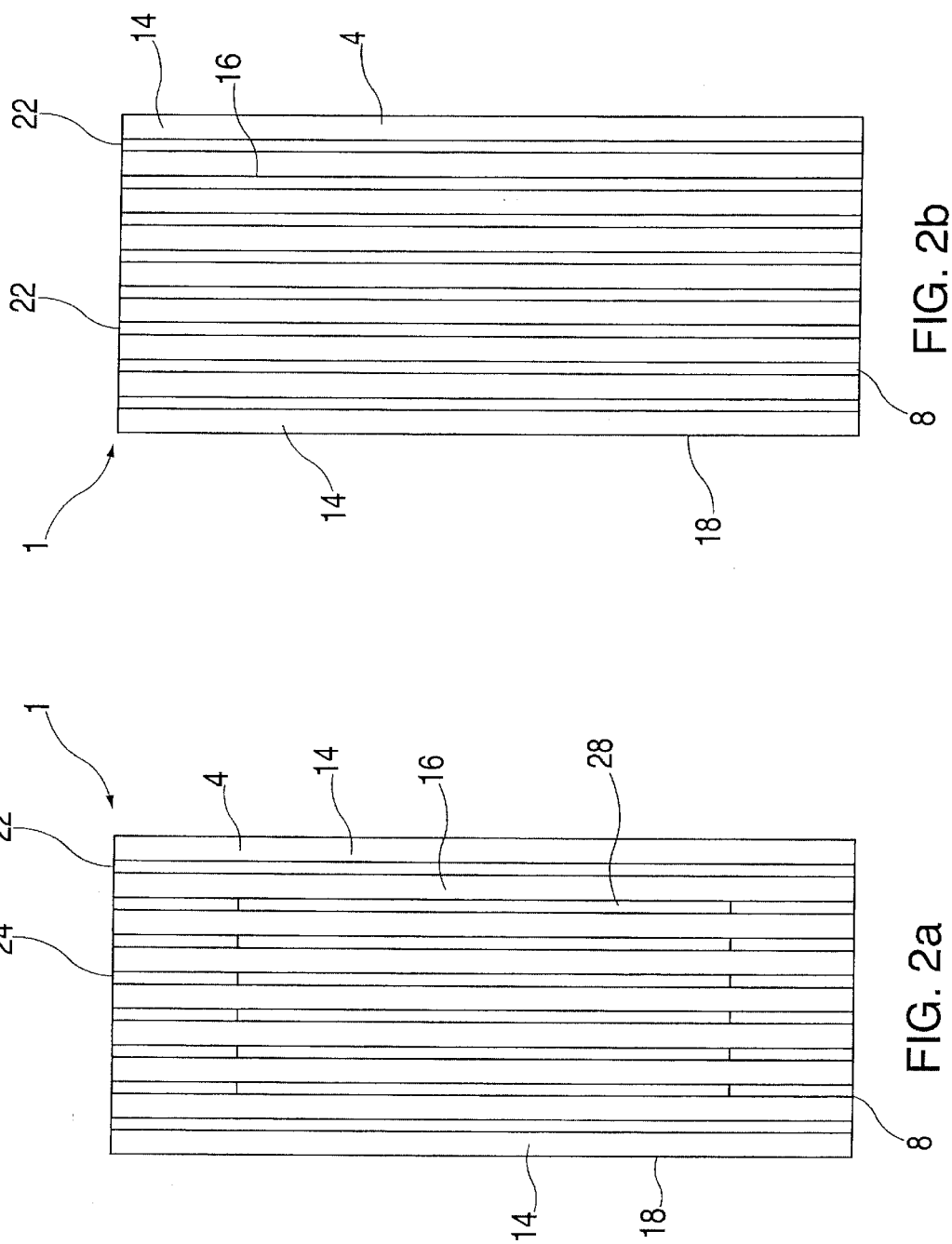

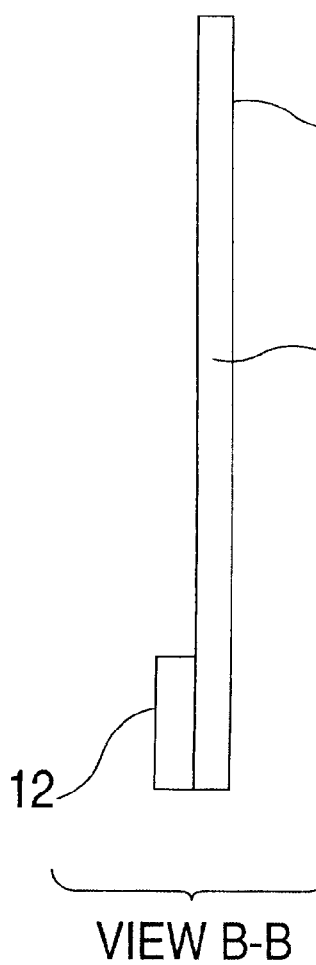
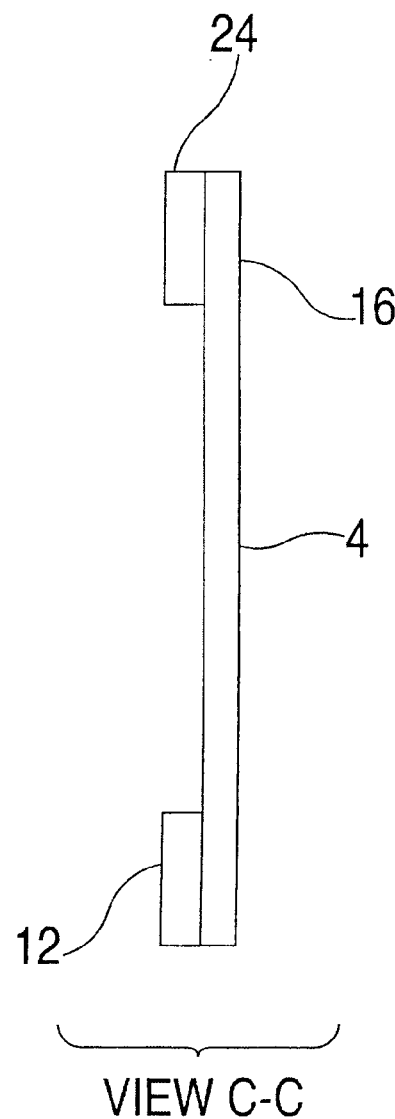
FIG. 4b
FIG. 4c

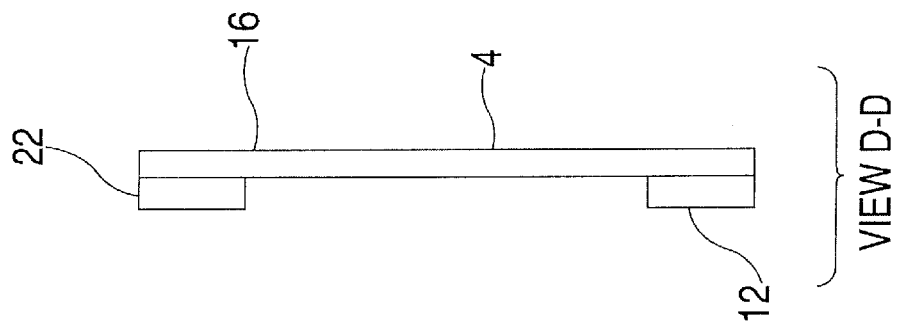
FIG. 4e VIEW D-D
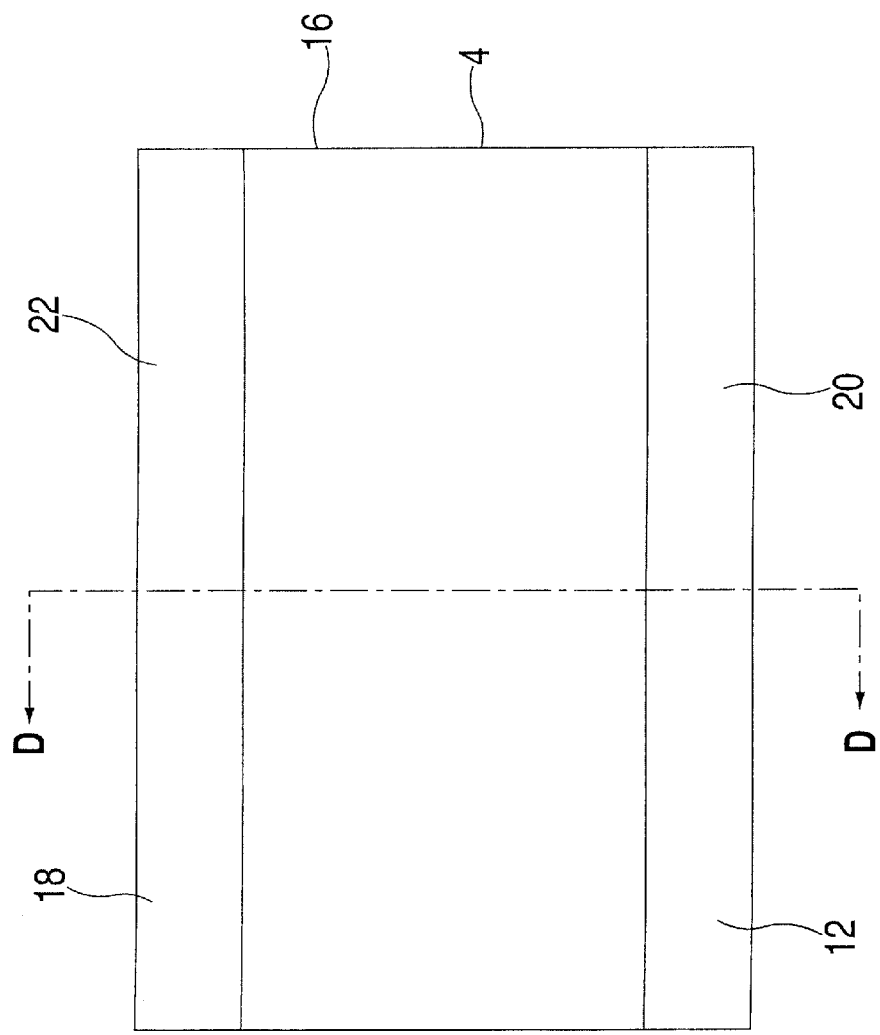
FIG. 4d

FOIL HEAT SINK AND A METHOD FOR FABRICATING SAME

FIELD OF THE INVENTION

The present invention relates generally to a heat sink and more particularly to a foil heat sink and a method for fabricating the same.

BACKGROUND OF THE INVENTION

As an electronic component operates, the electron flow within the component generates heat. If this heat is not removed, or dissipated, the electronic component may not operate correctly and may become damaged. Typically, the heat generated by the electronic component is dissipated by a cooling means, such as an aluminum (Al) or copper (Cu) heat sink which absorbs and dissipates the heat via direct air convection. Heat sinks are well known in the electronics industry and are used extensively to dissipate heat generated by electronic components used in computers and various other electronic equipment.

However, improvements in integrated circuit (IC) design and fabrication techniques are allowing IC manufacturers to produce smaller IC devices and other electronic components which operate at increasingly faster speeds and which perform an increasingly higher number of operations. As the operating speed and operational parameters of an electronic component increases, so to does the heat generated by these components. As a result, aluminum (Al) or copper (Cu) heat sinks that use conventional direct air cooling technology, or direct air convection, to dissipate heat are fast approaching the limits of their cooling abilities and it is becoming increasingly difficult to dissipate this increased heat. This is true even for electronic components that were once considered to be a low power technology and as such low heat generators, such as complementary metal oxide semiconductor, or CMOS, circuitry.

SUMMARY OF THE INVENTION

A foil heat sink comprising: a fin body, wherein the fin body includes a plurality of heat sink fins having a fin head and a fin foot and wherein the plurality of heat sink fins are disposed in a parallel fashion so as to form a plurality of horizontal channels between the plurality of heat sink fins; a fin support, wherein the fin support includes a plurality of fin support structures disposed between the plurality of heat sink fins so as to separate the plurality of heat sink fins and wherein the plurality of fin support structures are disposed adjacent to the fin head so as to form a plurality of vertical channels between the plurality of heat sink fins; and a fin base, wherein the fin base includes a plurality of fin spacers disposed between the plurality of heat sink fins so as to separate the plurality of heat sink fins and wherein the plurality of fin spacers are disposed so as to be adjacent to the fin foot.

A method for fabricating a foil heat sink comprising: obtaining a plurality of fin support structures, a plurality of fin spacers and a plurality of heat sink fins, wherein each the plurality of heat sink fins include a fin head and a fin foot; arranging the plurality of fin support structures, the plurality of fin spacers and the plurality of heat sink fins so as to create a heat sink arrangement wherein the plurality of heat sink fins are disposed parallel with each other and wherein the plurality of fin spacers are disposed between the plurality of heat sink fins so as to be adjacent to the fin foot and wherein the plurality of fin support structures are disposed between the plurality of heat sink fins so as to be adjacent to the fin head; and processing the heat sink arrangement so as to cause the plurality of fin support structures, the plurality of fin spacers and the plurality of heat sink fins to bond together.

BRIEF DESCRIPTION OF THE DRAWINGS

FIG. 2a is a top down view of a graphite foil heat sink having an impinging-flow configuration in accordance with a first embodiment;

FIG. 2b is a top down view of a graphite foil heat sink having a cross-flow configuration in accordance with a first embodiment;

FIG. 4b is a cross-sectional side view, B—B, of an internal fin of a graphite foil heat sink having an impinging-flow configuration in accordance with a first embodiment;

FIG. 4c is a cross-sectional side view, C—C, of an internal fin of a graphite foil heat sink having an impinging-flow configuration in accordance with a first embodiment;

FIG. 4d is a cross-sectional front view of graphite foil heat sink having an cross-flow configuration showing an internal fin in accordance with a first embodiment;

FIG. 4e is an cross-sectional side view, D—D, of an internal fin of a graphite foil heat sink having a cross-flow configuration in accordance with a first embodiment;

DETAILED DESCRIPTION OF THE INVENTION

Figure 1:
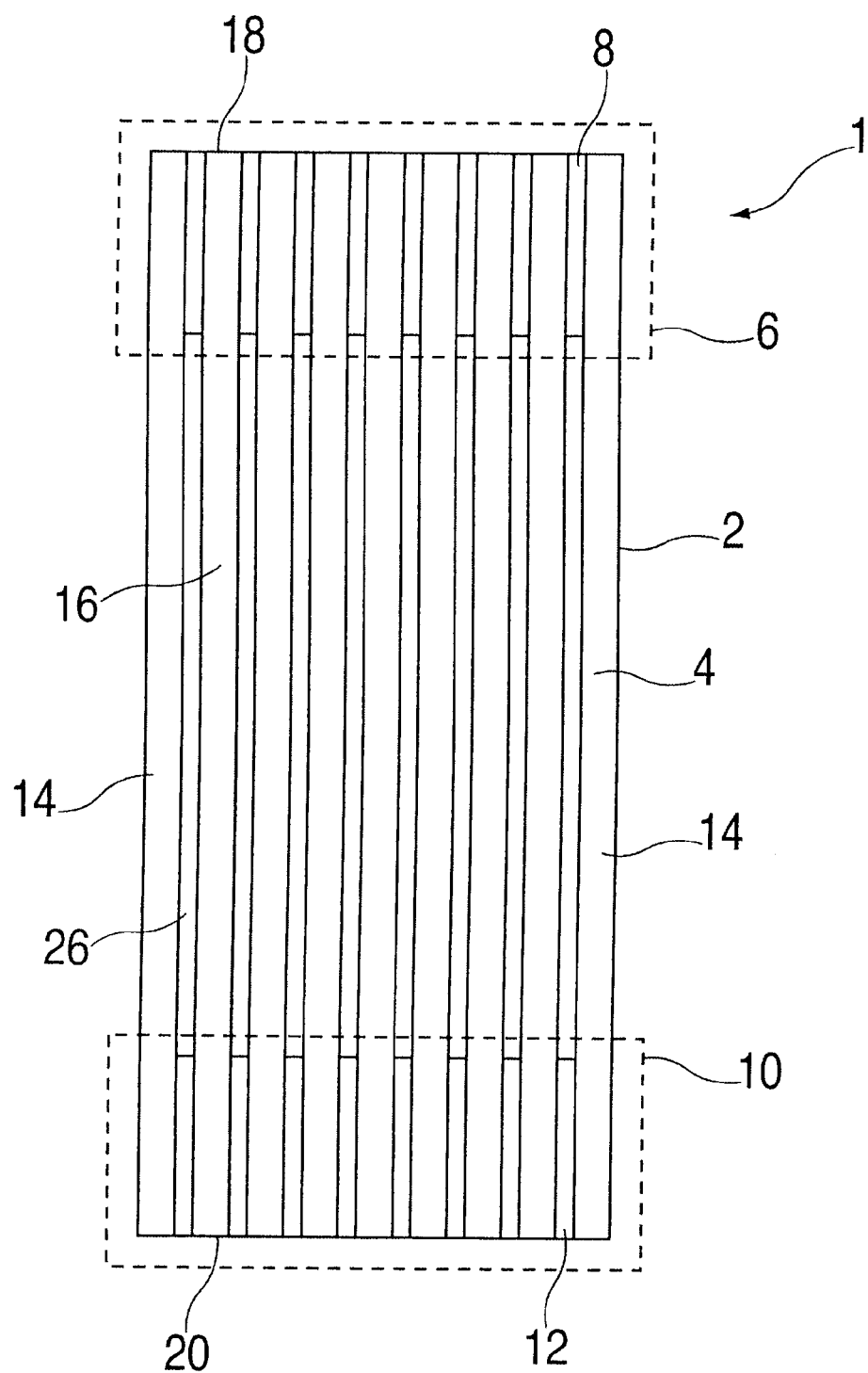
FIG. 1 is a side view of a graphite foil heat sink in accordance with a first embodiment.
Figures 3A, 3B:
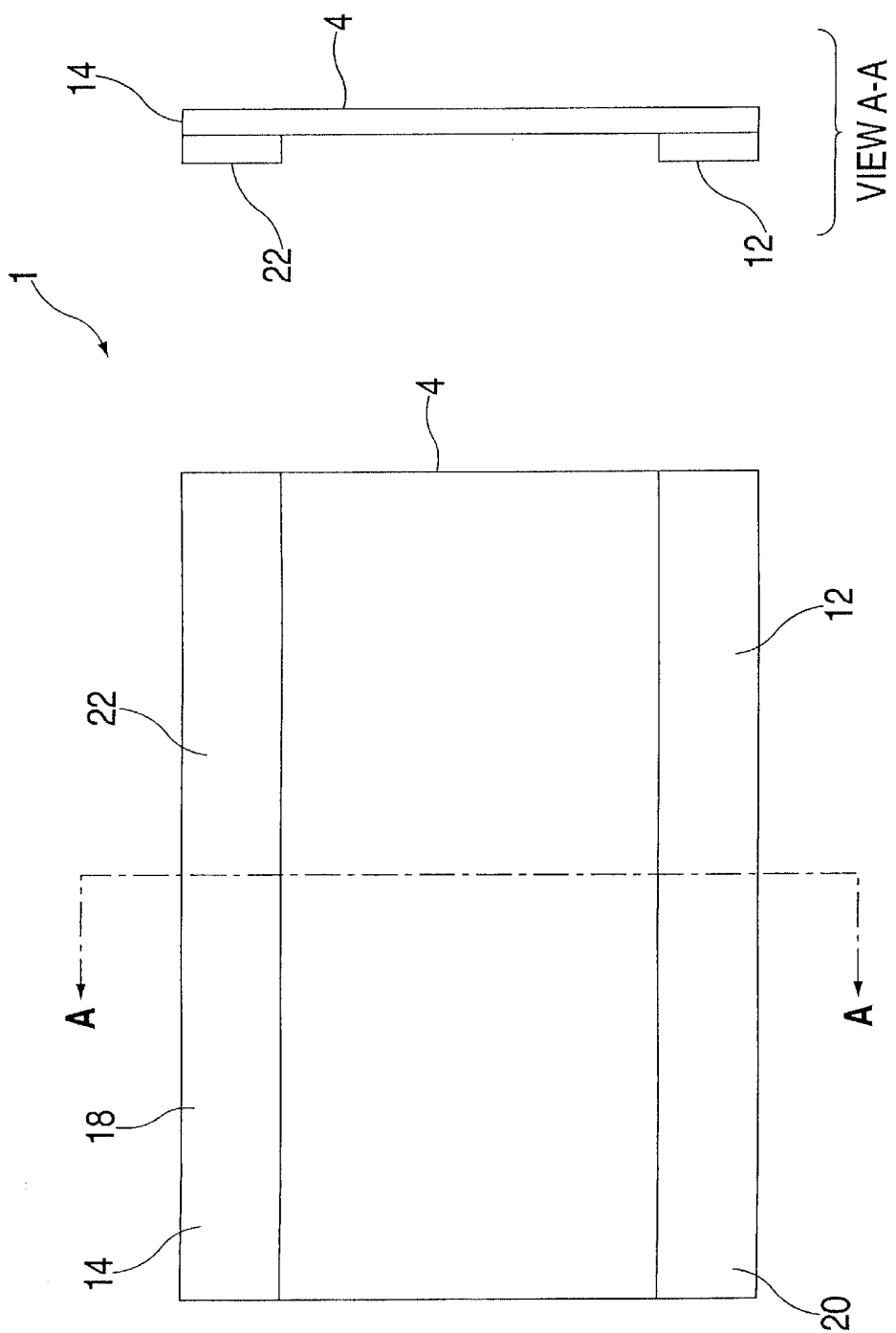
FIG. 3a is a front view of an external fin in accordance with a first embodiment.
FIG. 3b is a cross-sectional side view, A—A, of an external fin in accordance with a first embodiment.
Figure 4A:
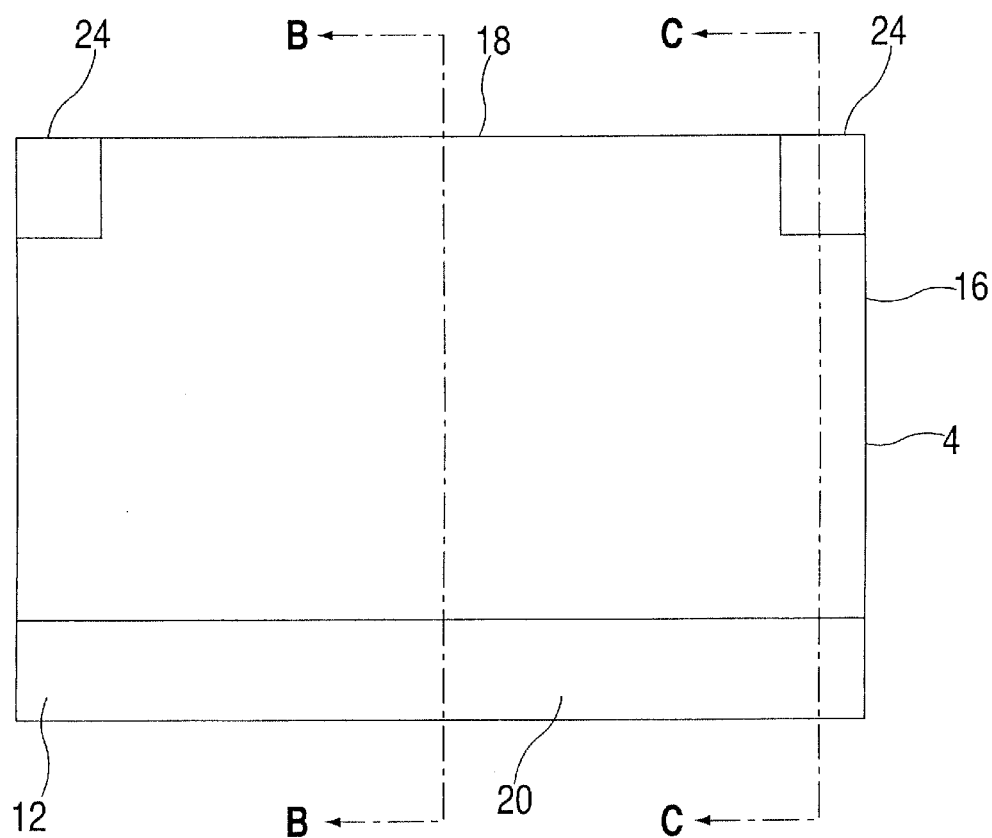
FIG. 4a is a cross-sectional front view of graphite foil heat sink having an impinging-flow configuration showing an internal fin in accordance with a first embodiment.
Figure 5:
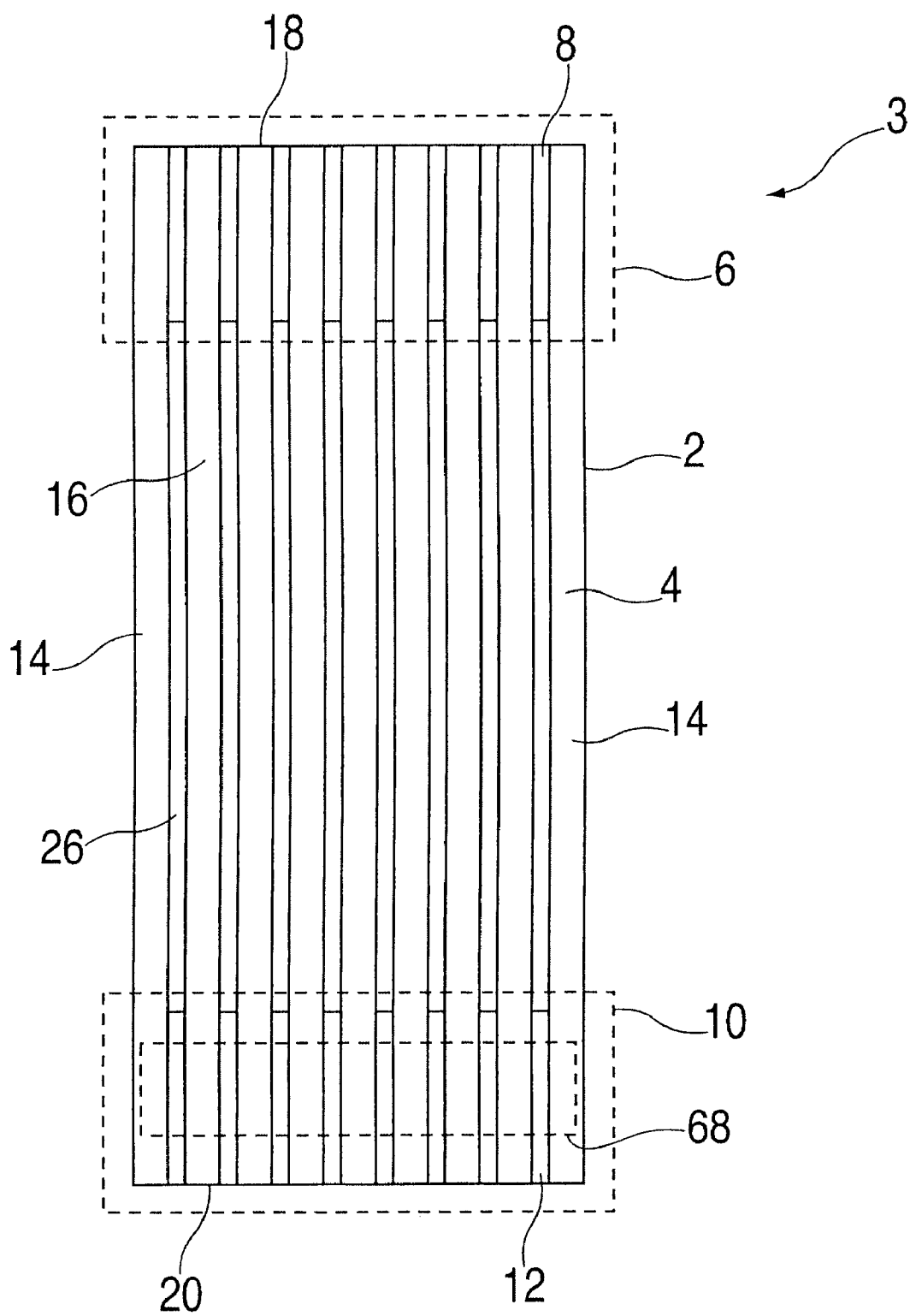
FIG. 5 is a side view of a graphite foil heat sink in accordance with a second embodiment.

Referring to the drawings, FIG. 1, FIG. 2a, FIG. 3a, FIG. 3b, FIG. 4a, FIG. 4b and FIG. 4c illustrates a foil heat sink 1 having an impinging-flow configuration in accordance with a first embodiment and preferably includes a fin body 2 having a plurality of heat sink fins 4, a fin support 6 having a plurality of fin support structures 8 and a fin base 10 having a plurality of fin spacers 12. Heat sink fins 4 preferably include a plurality of external fins 14 and a plurality of internal fins 16, wherein internal fins 16 are disposed between external fins 14 in a sandwich fashion such that external fins 14 are disposed on the outer most portion of foil heat sink 1. In addition, heat sink fins 4 preferably include a fin head 18 and a fin foot 20, wherein heat sink fins 4 are preferably disposed so as to be adjacent to and parallel with each other. In accordance with a first embodiment, fin spacers 12 are preferably disposed between heat sink fins 4 in a sandwich fashion so as to separate heat sink fins 4 from each other.

Fin support structures 8 preferably include a plurality of elongated support structures 22 and a plurality of shortened support structures 24, wherein fin support structures 8 are preferably disposed between heat sink fins 4 so as to separate heat sink fins 4 from each other. In accordance with a first embodiment, one of the elongated support structures 22 is preferably disposed on one side of foil heat sink 1 so as to be between one of the external fins 14 and one of the internal fins 16. The other of the elongated support structures 22 is preferably disposed on the opposing side of foil heat sink 1 so as to be between the other of the external fins 14 and one of the internal fins 16. However, elongated support structures 22 and shortened support structures 24 may be dispose relative to each other in any manner suitable to the desired end purpose.

In accordance with a first embodiment, fin spacers 12 are preferably disposed so as to be adjacent to fin foot 20 and fin support structures 8 are preferably disposed so as to be adjacent to fin head 18. The disposition of fin support structures 8 and fin spacers 12 between heat sink fins 4, as described hereinabove, preferably create a plurality of horizontal channels 26 between heat sink fins 4, fin support structures 8 and fin spacers 12. Moreover, the disposition of the elongated support structures 22 nearest to the external fins 14 and the disposition of the shortened support structures 24 between the elongated support structures 22 and internal fins 16 preferably create a plurality of vertical channels 28 between heat sink fins 4 and fin support structures 8. This advantageously allows a fluid to flow into vertical channels 28, in an impinging-flow manner perpendicular to fin base 10, and out through horizontal channels 26, allowing the flowing fluid to assist cooling foil heat sink 1.

In accordance with a first embodiment, FIG. 1, FIG. 2b, FIG. 3a, FIG. 3b, FIG. 4d and FIG. 4e illustrates a foil heat sink 1 having a cross-flow configuration. In this configuration, shortened support structures 24 are replaced by elongated support structures 22 so as to eliminate vertical channels 28. This advantageously allows for a fluid flow through horizontal channels 26 in a cross-flow manner parallel to fin base 10 allowing the flowing fluid to assist cooling foil heat sink 1. However, in accordance with an exemplary embodiment, fin support 6 may include any arrangement of elongated support structures 22 and/or shortened support structures 24 suitable to the desired end purpose.

In accordance with a first embodiment, heat sink fins 4 are preferably constructed from sheets of a graphite and/or a graphite composite material. However, heat sink fins 4 may be constructed from any thermally conductive material suitable to the desired end purpose. This allows for a light weight heat sink having thermal conductivity that is anisotropic, meaning that there is high thermal conductivity in the in-plane of heat sink fins 4 (e.g. from fin foot 20 to fin head 18), but relatively low thermal conductivity in the direction perpendicular to heat sink fins 4. In addition, vertical channels 28 and horizontal channels 26 advantageously allow for fluid flow (e.g. air) through the structure of foil heat sink 1. This fluid flow coupled with the high thermal conductivity advantageously allows for efficient thermal dissipation via heat sink fins 4.

Referring to FIG. 5, FIG. 6a, FIG. 6b, FIG. 6c, FIG. 6d, FIG. 6e, FIG. 6f, FIG. 6g, FIG. 7, FIG. 8 and FIG. 9 a foil heat sink 3 having an impinging-flow configuration, in accordance with an alternate embodiment, is shown and described. In accordance with a second embodiment, foil heat sink 3 preferably includes a fin body 2 having a plurality of heat sink fins 4, a fin support 6 having a plurality of fin support structures 8 and a fin base 10 having a plurality of fin spacers 12. Heat sink fins 4 preferably include a plurality of external fins 14 and a plurality of internal fins 16, wherein internal fins 16 are disposed between external fins 14 in a sandwich fashion such that external fins 14 are disposed on the outer most portion of foil heat sink 3. In addition, heat sink fins 4 preferably include a fin head 18 and a fin foot 20, wherein heat sink fins 4 are preferably disposed so as to be adjacent to and parallel with each other.

In accordance with a second embodiment, fin support structures 8 preferably include a plurality of elongated support structures 22 and a plurality of shortened support structures 24, wherein fin support structures 8 are preferably disposed adjacent to fin head 18 and between heat sink fins 4 so as to separate heat sink fins 4 from each other. In accordance with a second embodiment, one of the elongated support structures 22 is preferably disposed on one side of foil heat sink 3 so as to be between one of the external fins 14 and one of the internal fins 16. The other of the elongated support structures 22 is preferably disposed on the opposing side of foil heat sink 3 so as to be between the other of the external fins 14 and one of the internal fins 16. However, elongated support structures 22 and shortened support structures 24 may be dispose relative to each other in any manner suitable to the desired end purpose.

In accordance with a second embodiment, heat sink fins 4 preferably include a fin opening 56 having a disengaged fin opening width a, an engaged fin opening width b and an opening edge 58. In addition, heat sink fins 4 also preferably include a fin notch 60 disposed so as to be associated with opening edge 58 so as to create an opening lip 62. Moreover, in accordance with a second embodiment, fin spacers 12 preferably include a spacer opening 64 having a spacer opening width c. Fin spacers 12 are preferably disposed adjacent to fin foot 20 and between heat sink fins 4 in a sandwich fashion so as to separate heat sink fins 4 from each other. In addition, fin spacers 12 are preferably disposed between heat sink fins 4 such that spacer opening 64 is adjacent to and communicated with fin opening 56.

In accordance with a second embodiment, foil heat sink 3 also preferably includes a mounting opening 66, a heat sink length l and a plurality of heat sink rods 68. Heat sink rods 68 preferably include a rod length m and a rod width d, wherein heat sink length l is preferably greater than or equal to rod length m and wherein rod width d is preferably larger than disengaged fin opening width a. In addition, heat sink rods 68 also preferably include a threaded portion 69 and a rod fastening opening 70. In accordance with a second embodiment, heat sink rods 68 are preferably disposed so as to be communicated with each heat sink fin 4 and each fin spacer 12, via fin opening 56 and spacer opening 64, respectively. When heat sink rods 68 are not disposed within fin opening 56, fin opening 56 has a width equal to disengaged fin opening width a. However, because rod width d is larger than disengaged fin opening width a, when heat sink rods 68 are disposed within fin opening 56, fin opening 56 has a width equal to engaged fin opening width b. In accordance with a second embodiment, opening lip 62 is preferably constructed of a thermally conductive resilient material, such that when heat sink rods 68 are communicated with fin opening 56, opening lip 62 flexes so as to allow fin opening 56 to receive heat sink rods 68, yet compresses against heat sink rods 68 so as to allow thermal communication between heat sink rods 68 and heat sink fins 4. In addition, heat sink rods 68 are preferably non-movably associated with foil heat sink 3 and are preferably disposed so as to allow communication with rod fastening opening 70 via mounting opening 66.

In accordance with a second embodiment, the disposition of fin support structures 8 and fin spacers 12 between heat sink fins 4, as described hereinabove, preferably create a plurality of horizontal channels 26 between heat sink fins 4, fin support structures 8 and fin spacers 12. Moreover, the disposition of the elongated support structures 22 nearest to the external fins 14 and the disposition of the shortened support structures 24 between the elongated support structures 22 and internal fins 16 preferably create a plurality of vertical channels 28 between heat sink fins 4 and fin support structures 8. In addition, vertical channels 28 and horizontal channels 26 advantageously allow for fluid flow (e.g. air) into vertical channels 28, in an impinging-flow manner perpendicular to fin base 10, and out through horizontal channels 26, allowing the flowing fluid to assist cooling foil heat sink 3.

Figure 6A:
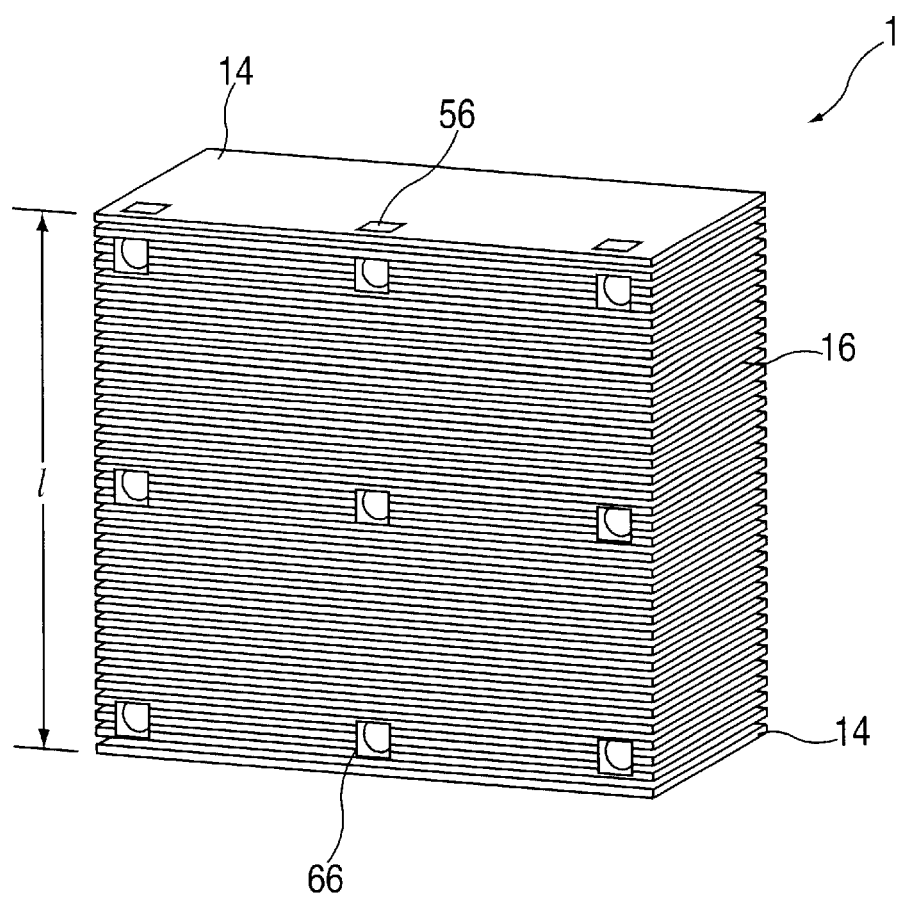
FIG. 6a is a bottom perspective view of a graphite foil heat sink in accordance with a second embodiment.
Figure 6B:
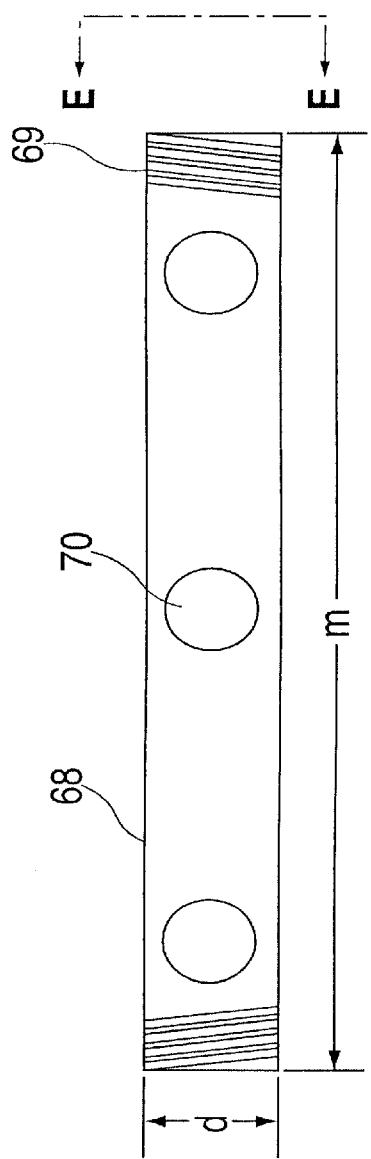
FIG. 6b is a front view of a heat sink rod in accordance with a second embodiment.
Figure 6C:
FIG. 6c is a side view, E—E, of a heat sink rod, in accordance with a second embodiment.
Figure 6D:
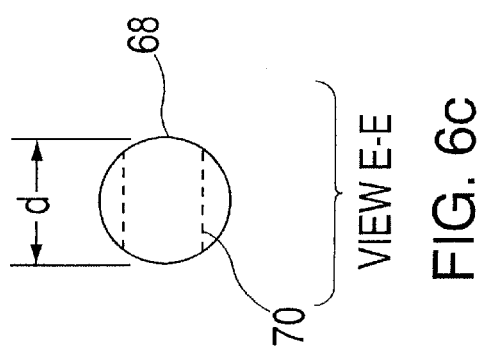
FIG. 6d is a side view of a mounting device, in accordance with a second embodiment.
Figure 6E:
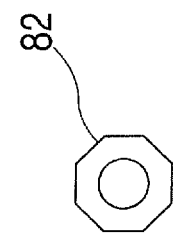
FIG. 6e is a top-down view of a fastening device, in accordance with a second embodiment.
Figure 6G:
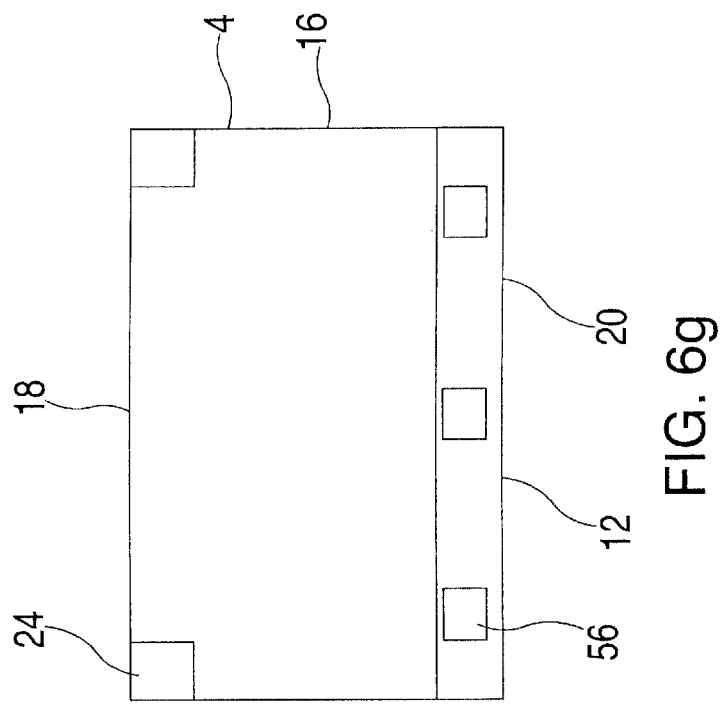
FIG. 6g is a cross-sectional front view of graphite foil heat sink having an impinging-flow configuration showing an internal fin, in accordance with a second embodiment.
Figure 6F:
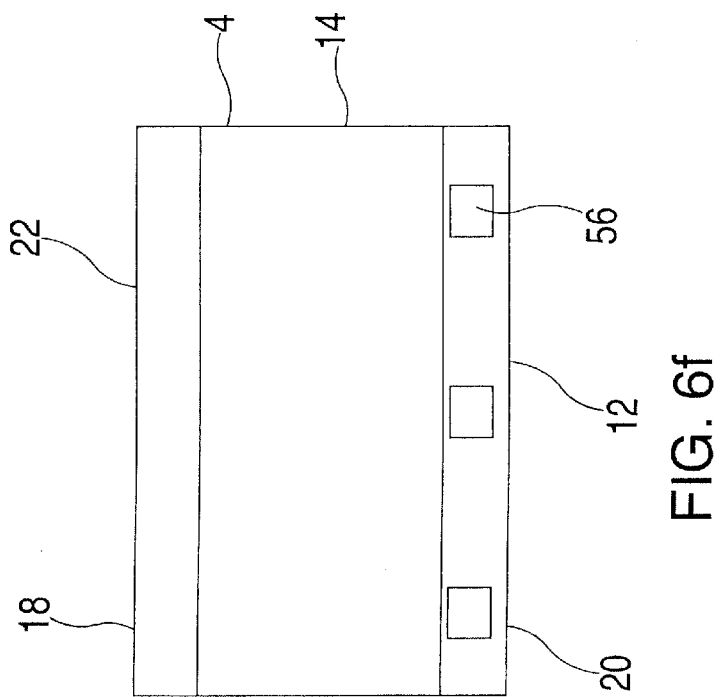
FIG. 6f is a front view of graphite foil heat sink having an impinging-flow configuration showing an external fin, in accordance with a second embodiment.
Figure 6I:
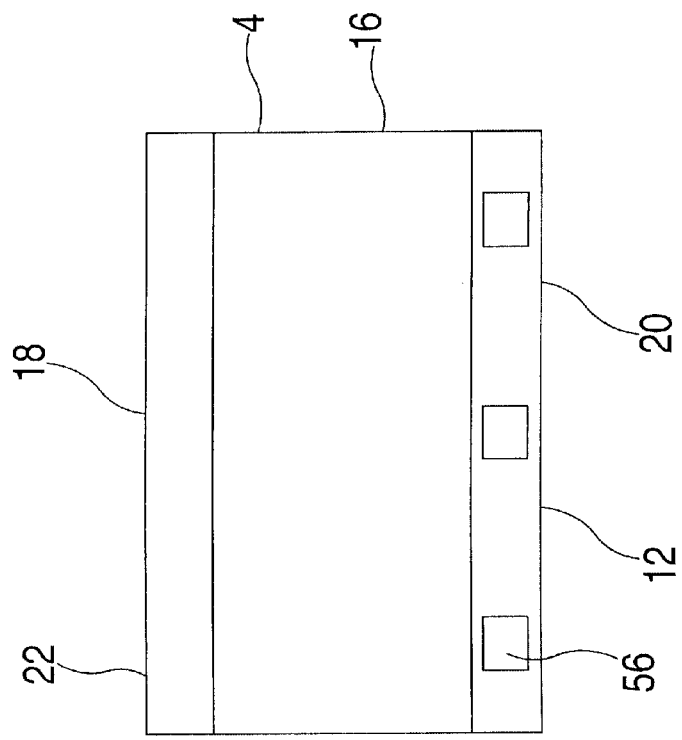
FIG. 6i is a cross-sectional front view of graphite foil heat sink having a cross-flow configuration showing an internal fin, in accordance with a second embodiment.
Figure 6H:
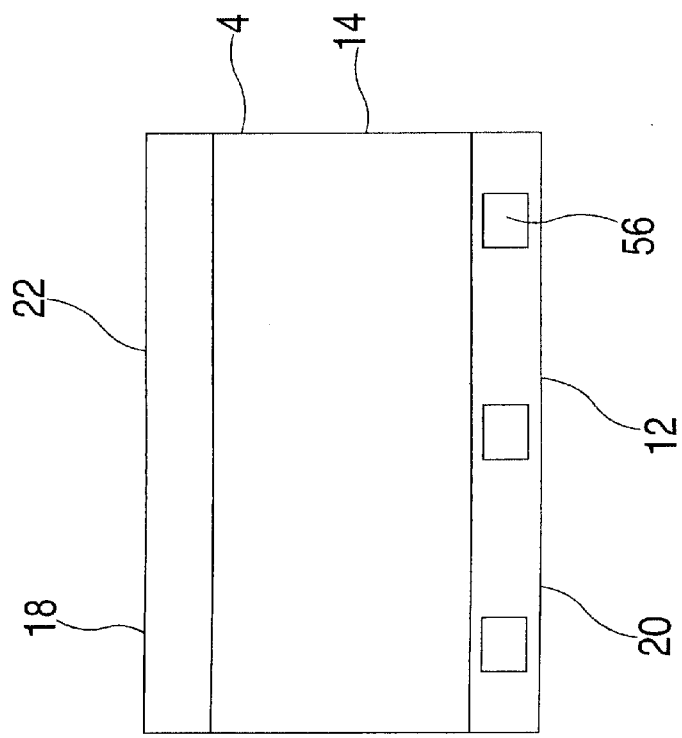
FIG. 6h is a front view of graphite foil heat sink having a cross-flow configuration showing an external fin, in accordance with a second embodiment.
Figure 7:
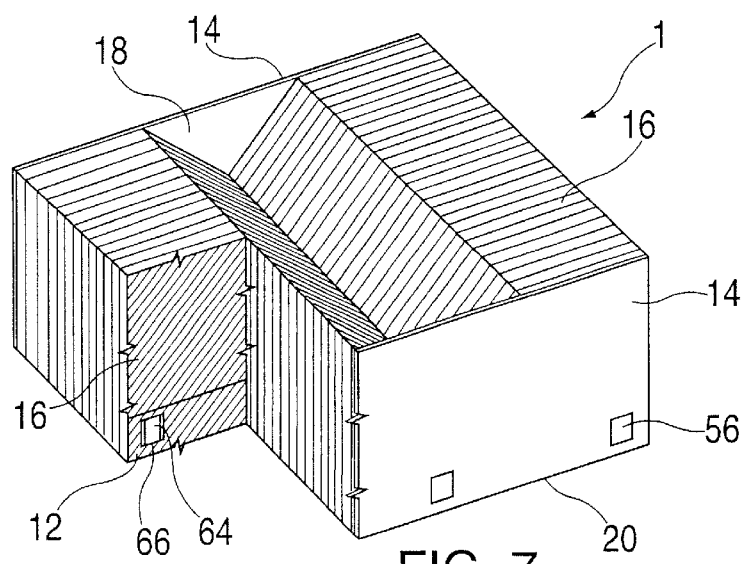
FIG. 7 is a top down perspective isometric view of graphite foil heat sink showing a cross-sectional view in accordance with a second embodiment.
Figure 8:
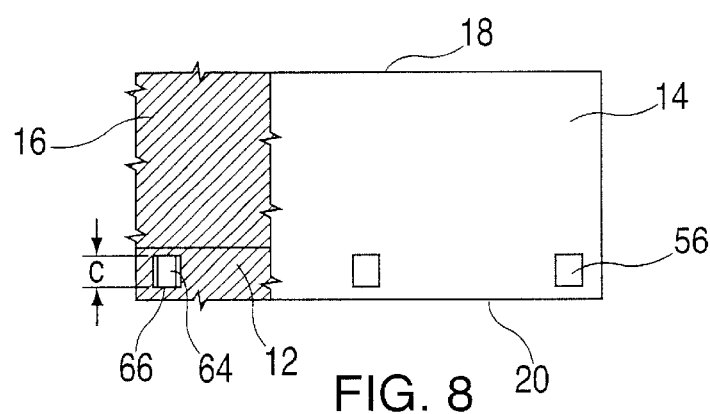
FIG. 8 is a rear view of graphite foil heat sink showing a cross-sectional view in accordance with a second embodiment.
Figure 9:
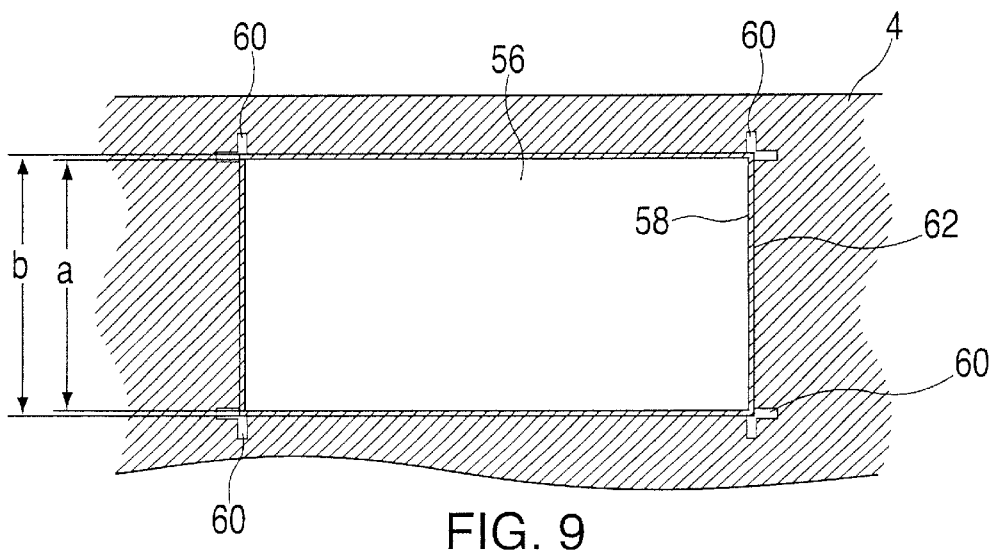
FIG. 9 is a front view of a heat sink fin showing a fin opening in accordance with a second embodiment.

In accordance with a second embodiment, foil heat sink 3 may also include a cross-flow configuration by replacing shortened support structures 24 with elongated support structures 22 between internal fins 16, as shown in FIG. 6h, FIG. 6i. In this configuration, shortened support structures 24 are replaced by elongated support structures 22 so as to eliminate vertical channels 28. This advantageously allows for a fluid flow through horizontal channels 26 in a cross-flow manner parallel to fin base 10 allowing the flowing fluid to assist cooling foil heat sink 3. However, in accordance with an exemplary embodiment, fin support 6 may include any arrangement of elongated support structures 22 and/or shortened support structures 24 suitable to the desired end purpose.

In accordance with a second embodiment, heat sink fins 4 are preferably constructed from sheets of a graphite and/or a graphite composite material. However, heat sink fins 4 may be constructed from any thermally conductive material suitable to the desired end purpose. This allows for a light weight heat sink having thermal conductivity that is anisotropic, meaning that there is high thermal conductivity in the in-plane of heat sink fins 4 (e.g. from fin foot 20 to fin head 18), but relatively low thermal conductivity in the direction perpendicular to heat sink fins 4. This also allows for an efficient dissipation of heat for an electronic module that is identical in size to foil heat sink 3, but for a foil heat sink 3 that is larger than the electronic module, the heat dissipation efficiency can be increased. This is because for a foil heat sink 3 that is identical in size to the electronic module, the heat flow is nearly one dimensional in nature, flowing from fin foot 20 to fin head 18 with a relatively consistent heat distribution across the surface area of foil heat sink 3. However, if the foil heat sink 3 is larger than the electronic module, the anisotropic property of foil heat sink 3 prevents consistent heat distribution across the surface area of foil heat sink 3. As a result there is surface area of foil heat sink 3 that is not being used to dissipate heat. Therefore, the heat dissipation efficiency of foil heat sink 3 may be increased by evenly distributing the heat generated by an electronic module over the entire surface area of foil heat sink 3. This is advantageously accomplished via the addition of heat sink rods 68.

In accordance with a second embodiment, heat sink rods 68 are preferably constructed of a copper material. Heat sink rods 68 are preferably disposed within fin opening 56 and spacer opening 64, so as to be in thermal communication with fin spacer 12 and heat sink fins 4. This advantageously allows for a high thermal conductivity path parallel to and perpendicular to heat sink fins 4 that effectively distributes heat over foil heat sink 3. In accordance with an exemplary embodiment, heat generated from an electronic module flows into foil heat sink 3 via fin base 10. Due to the thermal communication between fin base 10, heat sink rods 68 and heat sink fins 4, heat is readily transferred into both heat sink rods 68 and heat sink fins 4. Heat sink fins 4 preferably have a high thermal conductivity which allows heat to flow easily from fin foot 20 to fin head 18 and heat sink rods 68 preferably have a high thermal conductivity which allows heat to flow easily throughout rod length m and rod width d readily transferring heat to heat sink fins 4. This advantageously allows for an efficient distribution of heat over foil heat sink 3. Thus, heat will flow through heat sink rods 68 into contacting heat sink fins 4 so as to be consistently and evenly distributed across foil heat sink 3. This even distribution of heat coupled with the fluid flow through vertical channels 28 and/or horizontal channels 26 advantageously allows for efficient thermal dissipation via foil heat sink 3.

In accordance with an exemplary embodiment, heat sink rods 68 are preferably constructed of copper. However, heat sink rods 68 may be constructed of any material having thermal conductivity characteristics suitable to the desired end purpose, such as aluminum. In addition, heat sink rods 68 are preferably perpendicular is shape. However, heat sink rods 68 may be of any size and shape suitable to the desired end purpose, so as to provide structural support to foil heat sink 3 and/or so as to allow an efficient heat flow spread across foil heat sink 3.

Figure 10:
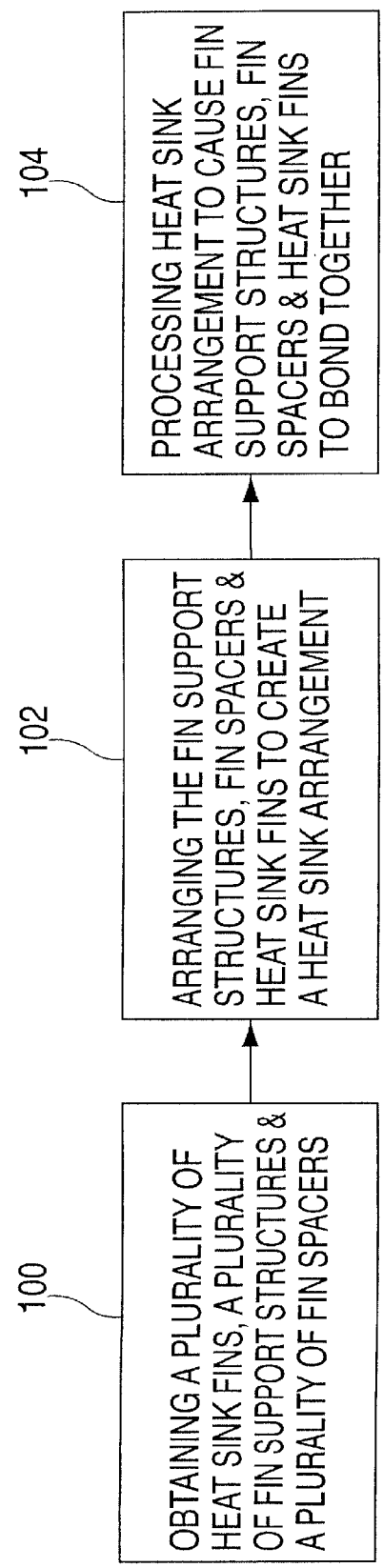
FIG. 10 is a flow chart of a method for fabricating a graphite foil heat sink in accordance with an exemplary embodiment.

Referring to FIG. 10, a method for fabricating foil heat sink 1 is illustrated and discussed in accordance with a first embodiment. As shown in step 100, a plurality of fin support structures 8, a plurality of fin spacers 12 and a plurality of heat sink fins 4, each having a fin head 18 and a fin foot 20, are obtained. A heat sink arrangement is then created by arranging the plurality of fin spacers 12, plurality of fin support structures 8 and the plurality of heat sink fins 4 in a sandwich fashion as shown in step 102 and as described hereinabove. Plurality of heat sink fins 4 are preferably disposed relative to each other so as to be parallel with each other are preferably disposed such that the fin head 18 of each heat sink fin 4 are adjacent to each other and the fin foot 20 of each heat sink fin 4 are adjacent to each other. In addition, heat sink fins 4 are also preferably disposed such that internal fins 16 are between external fins 14.

Plurality of fin spacers 12 are preferably disposed between plurality of heat sink fins 4 so as to be adjacent to the fin foot 20. Plurality of fin support structures 8 are preferably disposed between plurality of heat sink fins 4 so as to be adjacent to the fin head 18, wherein the elongated support structures 22 are disposed between external fin 14 and internal fin 16 and the shortened support structures 24 are disposed between the internal fins 16. If plurality of fin spacers 12 and/or plurality of fin support structures 8 are constructed of graphite, then a titanium-zirconium-beryllium alloy may be used to metallurgically bond the fin spacers 12 to the heat sink fins 4. This is done by inserting a thin foil sheet constructed of a titanium-zirconium-beryllium alloy between the heat sink fins 4 and the fin spacers 12 and/or the heat sink fins 4 and the fin support structures 8. However, if plurality of fin spacers 12 and/or plurality of fin support structures 8 are constructed of copper, then the heat sink fins 4 should be plated with a chrome/copper metal stack so that the heat sink fins 4 can be soldered to the fin spacers 12 and/or fin support structures 8.

Once the heat sink arrangement has been created as shown in step 102, the heat sink arrangement is then processed as shown in step 104. This is done by heating the heat sink arrangement using a heating device, such as a furnace, so as to cause the plurality of fin support structures 8 and the plurality of fin spacers 12 to bond to the plurality of heat sink fins 4.

Again referring to FIG. 10, a method for fabricating foil heat sink 3 is illustrated and discussed in accordance with a second embodiment. As shown in step 100, a plurality of fin support structures 8, a plurality of fin spacers 12 and a plurality of heat sink fins 4, each having a fin head 18 and a fin foot 20, are obtained. A heat sink arrangement is then created by arranging the plurality of fin spacers 12, plurality of fin support structures 8 and the plurality of heat sink fins 4 in a sandwich fashion as shown in step 102. Plurality of heat sink fins 4 are preferably disposed relative to each other so as to be parallel with each other. In addition, plurality of heat sink fins 4 are preferably disposed such that the fin head 18 of each heat sink fin 4 are adjacent to each other and the fin foot 20 of each heat sink fin 4 are adjacent to each other. In addition, heat sink fins 4 are also preferably disposed such that internal fins 16 are between external fins 14.

In accordance with a second embodiment, plurality of fin spacers 12 are preferably disposed between plurality of heat sink fins 4 so as to be adjacent to the fin foot 20. In addition, plurality of fin spacers 12 are preferably disposed such that spacer opening 64 is adjacent to fin opening 56 so as to allow communication with spacer opening 64 through fin opening 56. Plurality of fin support structures 8 are preferably disposed between plurality of heat sink fins 4 so as to be adjacent to the fin head 18, wherein the elongated support structures 22 are disposed external fins 14 and internal fins 16 and the shortened support structures 24 are disposed between the internal fins 16. If plurality of fin spacers 12 and/or plurality of fin support structures 8 are constructed of graphite, then a titanium-zirconium-beryllium alloy may be used to metallurgically bond the fin spacers 12 to the heat sink fins 4. This is done by inserting a thin foil sheet constructed of a titanium-zirconium-beryllium alloy between the heat sink fins 4 and the fin spacers 12 and/or the heat sink fins 4 and the fin support structures 8. However, if plurality of fin spacers 12 and/or plurality of fin support structures 8 are constructed of copper, then the heat sink fins 4 should be plated with a chrome/copper metal stack so that the heat sink fins 4 can be soldered to the fin spacers 12 and/or fin support structures 8.

In accordance with an exemplary embodiment, although heat sink fins 4 are shown as being plated with a chrome/copper metal stack, any plating material suitable to the desired end purpose may be used. In addition, heat sink fins 4 may be plated via any plating device or method suitable to the desired end purpose, such as ion sputtering, electro-less plating and/or electroplating.

In accordance with a second embodiment, once the heat sink arrangement has been created as shown in step 102, the heat sink arrangement is then processed as shown in step 104. This is done by heating the heat sink arrangement using a heating device, such as a furnace, so as to cause the plurality of fin support structures 8 and the plurality of fin spacers 12 to bond to the plurality of heat sink fins 4. Once the fin support structures 8 and the fin spacers 12 bond to the heat sink fins 4, heat sink rod 68 is inserted into fin opening 56 of external fin 44 so as to be communicated with each external fin 14, each internal fin 16 and each fin spacer 12. In addition, heat sink rod 68 is preferably disposed such that rod fastening opening 70 is associated with mounting opening 66 so as to allow communication with mounting opening 66 via rod fastening opening 70. In addition, heat sink rod 68 is preferably disposed such that threaded rod end 69 is protruding from fin opening 56. In accordance with a second embodiment, heat sink rod 68 is then non-movably associated with foil heat sink 3 by applying a fastening device 80 to rod fastening opening 70 via mounting opening 66 and by applying a mounting device 82 to threaded rod end 69. In addition, heat sink rods 68 may be non-movably associated with foil heat sink 3 via any suitable device or method, such as bonding heat sink rods 68 to heat sink fins 4.

In accordance with an exemplary embodiment, although heat sink rods 68 are shown to include a threaded portion 69 and a rod fastening opening 70 for non-movably associating heat sink rods 68 to foil heat sink 3, heat sink rods 68 may be non-movably associated with foil heat sink 3 using any device or method suitable to the desired end purpose, such as metallurgically attaching heat sink rods 68 to heat sink fins 4 via solder and/or braze.

In accordance with an exemplary embodiment, plurality of heat sink fins 4 are preferably constructed of a thermally conductive material, such as carbon/graphite composite material. However, plurality of heat sink fins 4 may be constructed of any thermally conductive material suitable to the desired end purpose.

In accordance with an exemplary embodiment, plurality of fin support structures 8 are preferably constructed of a thermally conductive material, such as copper. However, plurality of fin support structures 8 may be constructed of any thermally conductive material suitable to the desired end purpose, such as graphite.

In accordance with an exemplary embodiment, plurality of fin spacers 12 are preferably constructed of a thermally conductive material, such as copper. However, plurality of fin spacers 12 may be constructed of any thermally conductive material suitable to the desired end purpose, such as graphite.

In accordance with an exemplary embodiment, heat sink rod 68 is preferably constructed from a copper material. However, heat sink rod 68 may be constructed from any material suitable to the desired end purpose. In addition, mounting device 82 is preferably a bolt sized so as to allow mounting device 82 to fasteningly interact with threaded portion 69 of heat sink rod 68. However, mounting device 82 may be any mounting device 82 or method suitable to the desired end purpose. Moreover, fastening device 80 is preferably a screw sized so as to allow fastening device 80 to mountingly interact with rod fastening opening 70 of heat sink rod 68. However, fastening device 80 may be any fastening device 80 or method suitable to the desired end purpose.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

We claim:

1. A foil heat sink comprising:
   a fin body, wherein said fin body includes a plurality of heat sink fins having a fin head and a fin foot, wherein said plurality of heat sink fins are disposed in a parallel fashion and spaced from each other so as to form a plurality of horizontal channels between each of said plurality of heat sink fins, each horizontal channel extending from a first end extending between said fin head and said fin foot to a second edge opposite said first end extending between said fin head and said fin foot to provide fluid communication between first and second ends, a distance between said first end and said second end defining a width of each heat sink fin while a distance between said fin head and said fin foot define a length of said each heat sink fin;
   a fin support, wherein said fin support includes a plurality of fin support structures disposed between said plurality of heat sink fins so as to separate said plurality of heat sink fins and wherein said plurality of fin support structures are disposed adjacent to said fin head so as to form a plurality of vertical channels between said plurality of heat sink fins, said vertical channels extending from said fin head to said fin foot;
   a fin base, wherein said fin base includes a plurality of fin spacers, each fin spacer disposed between contiguous heat sink fins of said plurality of heat sink fins so as to separate said contiguous heat sink fins and wherein said plurality of fin spacers are disposed so as to be adjacent to said fin foot;
   a heat sink rod constructed of a thermally conductive material, wherein said heat sink rod is disposed so as to be thermally communicated with said plurality of heat sink fins and said fin base; and
   a fastening device and a mounting device and wherein said heat sink rod includes a threaded portion and a rod fastening opening, said fastening device being communicated with said rod fastening opening and said mounting device being communicated with said threaded portion so as to non-movably associate said heat sink rod with said foil heat sink.

2. A foil heat sink according to claim 1, wherein said plurality of heat sink fins are disposed so as to be non-movably associated with said fin support and said fin base.

3. A foil heat sink according to claim 1, wherein said plurality of fin support structures are metallurgically bonded with said plurality of heat sink fins using a titanium-zirconium-beryllium alloy material.

4. A foil heat sink according to claim 1, wherein said plurality of fin spacers are metallurgically bonded with said plurality of heat sink fins using a titanium-zirconium-beryllium alloy material.

5. A foil heat sink according to claim 1, wherein said plurality of heat sink fins, said plurality of fin spacers and said plurality of fin support structures are constructed of a thermally conductive material.

6. A foil heat sink according to claim 1, wherein said plurality of heat sink fins, said plurality of fin spacers and said plurality of fin support structures are constructed of a graphite composite material.

7. A foil heat sink according to claim 1, wherein each of said plurality of fin spacers define a spacer opening and each of said plurality of heat sink fins define a fin opening, wherein said spacer opening is disposed so as to be communicated with said fin opening.

8. A method for fabricating a foil heat sink comprising:
   obtaining a plurality of fin support structures, a plurality of fin spacers and a plurality of heat sink fins, wherein each of said plurality of heat sink fins include a fin head and a fin foot;
   arranging said plurality of fin support structures, said plurality of fin spacers and said plurality of heat sink fins so as to create a heat sink arrangement wherein said plurality of heat sink fins are disposed parallel with each other and wherein said plurality of fin spacers are disposed between said plurality of heat sink fins so as to be adjacent to said fin foot and wherein said plurality of fin support structures are disposed between said plurality of heat sink fins so as to be adjacent to said fin head, said arranging said plurality of heat sink fins includes each heat sink fin spaced from each other so as to form a horizontal channel between each of said plurality of heat sink fins, said horizontal channel extending from a first end extending between said fin head and said fin foot to a second end opposite said first end extending between said fin head and said fin foot to provide fluid communication between first and second ends, a distance between said first end and said second end defining a width of each heat sink fin while a distance between said fin head and said fin foot define a length of said each heat sink fin;
   processing said heat sink arrangement so as to cause said plurality of fin support structures, said plurality of fin spacers and said plurality of heat sink fins to bond together; and
   obtaining a heat sink rod, a fastening device and a mounting device, wherein said processing includes communicating said heat sink rod with said spacer opening via said fin opening and non-movably associating said heat sink rod with said foil heat sink via said fastening device and said mounting device, wherein said plurality of fin spacers define a spacer opening and wherein said plurality of heat sink fins define a fin opening and wherein said arranging includes arranging said heat sink fins and said fin spacers so as to allow fluid communication with said spacer opening via said fin opening.

9. A method according to claim 8, wherein said obtaining includes obtaining a thin foil of a titanium-zirconium-beryllium alloy.

10. A method according to claim 9, wherein said arranging includes disposing said thin foil of titanium-zirconiumberyllium alloy between said plurality of heat sink fins and said plurality of said fin spacers and between said plurality of heat sink fins and said plurality of fin support structures.

11. A method according to claim 8, wherein said arranging includes arranging said plurality of tin spacers and said plurality of fin support structures so as to create said horizontal channel between each said plurality of heat sink fins.

12. A method according to claim 8, wherein said arranging includes arranging said plurality of fin support structures so as to create a vertical channel between said plurality of heat sink fins, said vertical channel extending from said fin head to said fin foot.

13. A method according to claim 8, wherein said processing includes applying said heat sink arrangement to a furnace.

14. A method according to claim 8, wherein said processing includes plating each of said plurality of heat sink fins with a chrome/copper metal stank.

15. A method according to claim 8, wherein said processing includes soldering each of said plurality of heat sink fins to said plurality of said fin spacers and said plurality of fin support structures.

* * * * *